(12) United States Patent
Saito

(10) Patent No.: US 11,754,497 B2
(45) Date of Patent: Sep. 12, 2023

(54) METHOD FOR MEASURING EXTREMELY LOW OXYGEN CONCENTRATION IN SILICON WAFER

(71) Applicant: GLOBALWAFERS JAPAN CO., LTD., Niigata (JP)

(72) Inventor: Hiroyuki Saito, Niigata (JP)

(73) Assignee: GLOBALWAFERS JAPAN CO., LTD., Niigata (JP)

(*) Notice: Subject to any disclaimer, the term of this patent is extended or adjusted under 35 U.S.C. 154(b) by 283 days.

(21) Appl. No.: 17/294,741

(22) PCT Filed: Dec. 4, 2019

(86) PCT No.: PCT/JP2019/047366
§ 371 (c)(1),
(2) Date: May 18, 2021

(87) PCT Pub. No.: WO2020/129639
PCT Pub. Date: Jun. 25, 2020

(65) Prior Publication Data
US 2022/0018761 A1    Jan. 20, 2022

(30) Foreign Application Priority Data
Dec. 17, 2018 (JP) .................. 2018-235613

(51) Int. Cl.
*G01N 21/35* (2014.01)
*G01N 21/3563* (2014.01)

(52) U.S. Cl.
CPC . *G01N 21/3563* (2013.01); *G01N 2021/3568* (2013.01); *G01N 2021/3595* (2013.01)

(58) Field of Classification Search
CPC ................................. G01N 21/3563
See application file for complete search history.

(56) References Cited

U.S. PATENT DOCUMENTS 5,066,599 A    11/1991   Kaneta et al.
5,550,374 A    8/1996    Holzer et al.
(Continued)

FOREIGN PATENT DOCUMENTS

CN    103230803 B    7/2015
JP    H05312721 A    11/1993
(Continued)

OTHER PUBLICATIONS

Office Action dated Oct. 28, 2022, by the Intellectual Property Office in corresponding Korean Patent Application No. 10-2021-7018909, and an English Translation of the Office Action. (6 pages).
(Continued)

*Primary Examiner* — Hugh Maupin
(74) *Attorney, Agent, or Firm* — BUCHANAN INGERSOLL & ROONEY PC

(57) ABSTRACT

Provided is a method for measuring interstitial oxygen concentration in a silicon wafer easily and sensitively using FT-IR. The invention provides a method for measuring an extremely low oxygen concentration of $<1.0\times10^{16}$ atoms/$cm^3$ in a single-crystal silicon wafer, the method comprising: step 1 of forming a $SiO_2$ film, nitride film or PE film on each of a measurement wafer, interstitial-oxygen-free reference wafer and standard wafer with known interstitial oxygen concentration; step 2 of measuring IR spectra of the three wafers; step 3 of determining a difference transmission spectrum from the IR spectrum of measurement wafer and that of reference wafer and determining the intensity of an absorption peak corresponding to interstitial oxygen; and step 4 of comparing the peak intensity of the interstitial oxygen and that of standard wafer and calculating the interstitial oxygen concentration in measurement wafer from ratio to the interstitial oxygen concentration of standard wafer.

5 Claims, 2 Drawing Sheets

(56) References Cited

U.S. PATENT DOCUMENTS

| | | | | |
|---|---|---|---|---|
| 5,595,916 | A * | 1/1997 | Fujimura | ............ G01B 11/0625 |
| | | | | 250/341.4 |
| 5,598,452 | A * | 1/1997 | Takeno | ................ G01N 23/207 |
| | | | | 378/71 |
| 6,206,961 | B1 * | 3/2001 | Takeno | ............... H01L 21/3225 |
| | | | | 257/E21.321 |
| 2018/0088042 | A1 | 3/2018 | Ganagona et al. | |

FOREIGN PATENT DOCUMENTS

| | | |
|---|---|---|
| JP | H063268 A | 1/1994 |
| JP | H0749305 A | 2/1995 |
| JP | H 7-032186 B2 | 4/1995 |
| JP | H10154734 A | 6/1998 |
| JP | 2001217292 A | 8/2001 |
| KR | 10-1993-0011457 B1 | 12/1993 |
| KR | 10-2006-0072894 A | 6/2006 |
| TW | 201816201 A | 5/2018 |
| TW | 201828382 A | 8/2018 |
| TW | 201833240 A | 9/2018 |

OTHER PUBLICATIONS

International Search Report (PCT/ISA/210) with an English translation, and Written Opinion KPCT/ISA/237) dated Mar. 3, 2020, by the Japanese Patent Office as the International Searching Authority for International Application No. PCT/JP2019/047366. (10 pages).
Yanagiuchi, et al., "Thickness Measurement of Native Oxide Layer on the Polycrystal Silicon Exposed to the Air for Three Years", Journal of Surface Analysis, vol. 7, No. 2, 2000 (month unknown), pp. 218-227 (w/ English Abstract).

* cited by examiner

METHOD FOR MEASURING EXTREMELY LOW OXYGEN CONCENTRATION IN SILICON WAFER

TECHNICAL FIELD

The present invention relates to a method for measuring interstitial oxygen concentration in a silicon wafer.

BACKGROUND ART

The Fourier-transform infrared spectroscopy (FT-IR), the secondary ion mass spectrometry (SIMS), and the radioactivation analysis have been conventionally used to measure the oxygen concentration. Among these analytical methods, the radioactivation analysis is available for detection from a range of $10^{14}$ atoms/cm$^3$ and the SIMS has a detection limit of $5\times10^{15}$ atoms/cm$^3$. The FT-IR measurement is available only if the concentration exceeds approximately $10^{16}$ atoms/cm$^3$. The FT-IR is not superior to the other methods in that it requires a concentration of not less than $10^{16}$ atoms/cm$^3$. Nevertheless, it is widely used for the measurement of oxygen concentration of not less than $1\times10^{16}$ atoms/cm$^3$ because of its simple and easy usage.

In the conventional method for the measurement of oxygen concentration, the FT-IR has been regarded inappropriate for measuring the oxygen concentration, because the concentration of less than $1\times10^{16}$ atoms/cm$^3$, e.g., a range of $10^{15}$ atoms/cm$^3$ is too low. However, techniques such as the SIMS and the radioactivation analysis require larger-scale facilities than the FT-IR, so consequently only a few laboratories can satisfy the request. There is also another problem that the number of specimens measurable per hour is ⅒ to 1/100 of that using the FT-IR. Therefore, there is a growing demand for measuring oxygen concentration in silicon wafers with lower oxygen concentrations using the FT-IR.

In the method for measuring interstitial oxygen concentration in silicon wafers using the FT-IR, as described in NPL 1, the infrared absorption spectrum of a measurement wafer and that of a reference wafer (i.e., a wafer which includes no interstitial oxygen or has extremely low interstitial oxygen concentration in a single-crystal silicon) are measured, and then the interstitial oxygen concentration in the measurement wafer is obtained.

When the absorption spectra of a silicon wafer with low oxygen concentration is measured using the FT-IR, a large reverse absorption of convex downward shape is observed on the side of lower wave number (1050 cm$^{-1}$) than the infrared absorption due to the interstitial oxygen (FIG. 1). This reverse absorption is attributed to a native oxide adhered to an oxygen-free single-crystal silicon wafer (i.e., a wafer which includes no interstitial oxygen or has extremely low interstitial oxygen concentration in a single-crystal silicon) used as a reference. Because of the existence of the reverse absorption of convex downward shape, a baseline around the interstitial oxygen is not straight but curved. If the absorption due to the interstitial oxygen becomes larger, the amount of absorption corresponding to the interstitial oxygen can be quantified using the baseline interpolation method described in PTL 1. However, as shown in FIG. 1, the infrared absorption due to the interstitial oxygen in the silicon wafer with low oxygen concentration is so little that the absorption amount is extremely difficult to be quantified. When native oxides are removed in order to make the thicknesses of the measurement specimen silicon wafer and the reference silicon wafer uniform, the influence due to the absorption of the native oxide can be removed. But if the native oxides are removed every time before use, the reference may be damaged, so that the removal of the native oxide is impractical. There is another idea of a native oxide film grown on the specimen surface with the same thickness as the native oxide adhered on the reference. However, the native oxide on single-crystal silicon is approximately within 1 nm thick as described in NPL 1, and it takes several years to grow the native oxide to the thickness of the native oxide on the reference. Additionally, the growth rate depends on the surrounding environments, such as humidity. Therefore, it is difficult to adhere the same native oxide to the measurement wafer as to the reference artificially.

CITATION LIST

Patent Literature

PTL 1: Japanese Unexamined Patent Application Publication No. Hei06-3268

Non-Patent Literature

NPL 1: Journal of Surface Analysis Vol. 7, No. 2, (2000), pp. 218-227

SUMMARY OF INVENTION

Technical Problem

An object of the present invention is to provide a method for measuring extremely low oxygen concentration of less than $1\times10^{16}$ atoms/cm$^3$ in a silicon wafer easily and sensitively using the FT-IR.

Solution to Problem

The method for measuring oxygen concentration in a single-crystal silicon wafer according to the present invention is that for measuring an interstitial oxygen concentration of less than $1.0\times10^{16}$ atoms/cm$^3$ comprising steps 1 to 4. In the step 1, SiO$_2$ films of the same thickness are formed on each surface of a measurement silicon wafer (hereinafter referred to simply as a "measurement wafer"), an interstitial oxygen-free reference silicon wafer (hereinafter referred to simply as a "reference wafer"), and a standard silicon wafer with known interstitial oxygen concentration (hereinafter referred to simply as a "standard wafer"). In the step 2, infrared absorption spectra of the measurement wafer with SiO$_2$ film, the reference wafer with SiO$_2$ film, and the standard wafer with SiO$_2$ film are measured by Fourier-transform infrared spectroscopy (FT-IR). In the step 3, an infrared absorbance difference spectrum (transmission spectrum) is obtained from the infrared absorption spectrum of the measurement wafer with SiO$_2$ film and the infrared absorption spectrum of the reference wafer with SiO$_2$ film, and the absorption peak intensity corresponding to interstitial oxygen is thereby obtained. In the step 4, the interstitial oxygen concentration in the measurement wafer is calculated based on the interstitial oxygen concentration value of the standard wafer, comparing the peak intensity of the interstitial oxygen with the peak intensity of the interstitial oxygen of the standard wafer with SiO$_2$ film.

In the step 1, the SiO$_2$ film is preferably 2 to 40 nm thick.

The method for measuring oxygen concentration in a single-crystal silicon wafer according to the present invention is that for measuring an interstitial oxygen concentration of less than $1.0\times10^{16}$ atoms/cm³ comprising steps 1 to 4. In the step 1, nitride films of the same thickness are formed on each surface of a measurement wafer, an interstitial oxygen-free reference wafer, and a standard wafer with known interstitial oxygen concentration. In the step 2, infrared absorption spectra of the measurement wafer with nitride film, the reference wafer with nitride film, and the standard wafer with nitride film are measured by Fourier-transform infrared spectroscopy (FT-IR). In the step 3, a transmission spectrum is obtained from the infrared absorption spectrum of the measurement wafer with nitride film and the infrared absorption spectrum of the reference wafer with nitride film, and the absorption peak intensity corresponding to interstitial oxygen is thereby obtained. In the step 4, the interstitial oxygen concentration in the measurement wafer is calculated based on the interstitial oxygen concentration value of the standard wafer, comparing the peak intensity of the interstitial oxygen with the peak intensity of the interstitial oxygen of the standard wafer with nitride film.

In the step 1, the nitride film is preferably 1 to 10 nm thick.

The method for measuring oxygen concentration of a single-crystal silicon wafer according to the present invention is that for measuring an interstitial oxygen concentration of less than $1.0\times10^{16}$ atoms/cm³ comprising steps 1 to 4. In the step 1, polyethylene films are formed on each surface of a measurement wafer, an interstitial oxygen-free reference wafer, and a standard wafer with known interstitial oxygen concentration. In the step 2, infrared absorption spectra of the measurement wafer with polyethylene film, the reference wafer with polyethylene film, and the standard wafer with polyethylene film are measured by Fourier-transform infrared spectroscopy (FT-IR). In the step 3, a transmission spectrum is obtained from the infrared absorption spectrum of the measurement wafer with polyethylene film and the infrared absorption spectrum of the reference wafer with polyethylene film, and the absorption peak intensity corresponding to interstitial oxygen is thereby obtained. In the step 4, the interstitial oxygen concentration in the measurement wafer is calculated based on the interstitial oxygen concentration value of the standard wafer, comparing the peak intensity of the interstitial oxygen with the peak intensity of the interstitial oxygen of the standard wafer with polyethylene film.

Advantageous Effects of Invention

In the present invention, the infrared absorption attributed to the interstitial oxygen is observed more clearly than in prior art. The extremely low oxygen concentration of less than $1.0\times10^{16}$ atoms/cm³ in a silicon wafer can be easily and sensitively measured. The present invention enables the detection limit of the interstitial oxygen to improve to the level obtained by the SIMS, even if the FT-IR is used.

DESCRIPTION OF EMBODIMENTS

The method for measuring interstitial oxygen concentration in a single-crystal silicon wafer according to the present invention is that for measuring an extremely low oxygen concentration of less than $1.0\times10^{16}$ atoms/cm³ comprising steps 1 to 4. In the step 1, $SiO_2$ films of the same thickness are formed on each surface of a measurement wafer, an interstitial oxygen-free reference wafer, and a standard wafer with known interstitial oxygen concentration. In the step 2, infrared absorption spectra of the measurement wafer with $SiO_2$ film, the reference wafer with $SiO_2$ film, and the standard wafer with $SiO_2$ film are measured by Fourier-transform infrared spectroscopy (FT-IR). In the step 3, an infrared absorbance difference spectrum (transmission spectrum) is obtained using the infrared absorption spectrum of the measurement wafer with $SiO_2$ film and the infrared absorption spectrum of the reference wafer with $SiO_2$ film, and the absorption peak intensity corresponding to interstitial oxygen is thereby obtained. In the step 4, the interstitial oxygen concentration in the measurement wafer is calculated based on the interstitial oxygen concentration value of the standard wafer, comparing the peak intensity of the interstitial oxygen with the peak intensity of the interstitial oxygen of the standard wafer with $SiO_2$ film.

Known silicon wafers, or more specifically, wafers of sliced single-crystal silicon ingot grown by the Czochralski method are used as the measurement wafer, the reference wafer, and the standard wafer for use in the present invention. The measurement wafer is a silicon wafer to measure the interstitial oxygen concentration. The reference wafer is an interstitial oxygen-free silicon wafer, to be specific, a wafer free from interstitial oxygen or a wafer with extremely low interstitial oxygen concentration. The standard wafer is a silicon wafer with known interstitial oxygen concentration.

In the step 1, the method for forming $SiO_2$ films on each surface of the measurement wafer, the reference wafer and the standard wafer includes a method for depositing oxide films at a treatment temperature of 300° C. or less by chemical vapor deposition (CVD) and a method for applying liquid glass by spin coating.

The CVD is a method for heating plates which hold wafers to form oxide films on the wafers in condition of flowing reactant gases, such as silane ($SiH_4$) and oxygen. The film deposition temperature is 600° C. or less and preferably 50 to 300° C.

The spin coating is a method for producing glass ($SiO_2$) on wafer surfaces by applying liquid glass on the wafers and making it penetrate the wafers. The spin coating method can be carried out at normal temperature.

Figure 2:
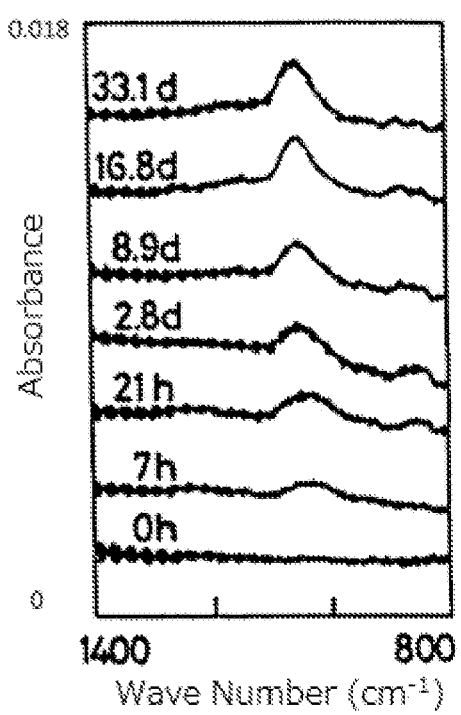
FIG. 2 illustrates infrared absorption spectra of a reference wafer. The native oxide being removed, the reference wafer was kept in the air. After a lapse of 0 hour, 7 hours, 21 hours, 2.8 days, 8.9 days, 16.8 days and 33.1 days, the IR absorption spectrum was measured using the wafer from which the oxide film was removed as a reference wafer.

The thicknesses of the oxide films formed by the foregoing methods are preferably 2 to 40 nm. It is more appropriate that $SiO_2$ films of the measurement wafer with $SiO_2$ film, the reference wafer with $SiO_2$ film, and the standard wafer with $SiO_2$ film be stably adhered and not changed with the passage of time. FIG. 2 shows a change of the infrared absorption due to a native oxide until the passage of 33.1 days right after the native oxide was removed from the reference wafer. The thicker the SiO$_2$ film is formed on the wafer, the much less the change with the passage of time becomes.

Furthermore, the thermal oxidation method, that is, the method for growing oxide films (SiO$_2$ films) on wafer surfaces by inserting the wafers in a high temperature reactor and then reacting silicon with oxygen or steam may be included.

In the step 1, instead of adhering SiO$_2$ films with thicknesses of 2 to 40 nm, nitride films with thicknesses of 0.1 nm or more or polyethylene (PE) films with thicknesses of 0.02 to 0.1 mm can be adhered to each surface of the measurement wafer, the reference wafer and the standard wafer, which are the other embodiments of the present invention.

It is desirable for nitride films of the measurement wafer with nitride film, the reference wafer with nitride film and the standard wafer with nitride film to adhere stably and not to change with the passage of time. The nitride film is specifically silicon nitride (Si$_3$N$_4$). It is produced by providing ammonia (NH$_3$) gas, and silane (SiH$_4$) gas or dichlorosilane (SiH$_2$Cl$_2$) gas on the wafer at a flow rate ratio of 2 to 30 (ammonia/silanes) and a deposition pressure of 13 to 133 Pa. The temperature and time are ordinarily 1000° C. and 1 hour.

When the silicon nitride film is deposited, a native oxide grows 0.2 to 1 nm on the wafer concurrently, which is a SiO$_2$ film to be inserted beneath the silicon nitride film. Therefore, prior to applying the nitride films, native oxides on the surfaces of the measurement wafer, the reference wafer, and the standard wafer should be removed. The removing method includes mechanical polishing and chemical polishing. As specific examples, the electric heating method under vacuum, and the cleaning method using a diluted aqueous solution of hydrofluoric acid or a mixture of hydrofluoric acid and ammonium fluoride are given.

The thicknesses of the nitride films are preferably 1 to 10 nm.

The polyethylene film is formed by the following procedure. A wafer is put into a polyethylene bag, and the bag is vacuum degassed and then fused to seal its opening. Polyethylene films of the measurement wafer with polyethylene film, the reference wafer with polyethylene film, and the standard wafer with polyethylene film formed in this way are stably preserved and not changed with the passage of time.

The thicknesses of the polyethylene films are ordinarily preferably 0.02 to 0.1 mm.

Even in the case of applying nitride films or polyethylene films instead of SiO$_2$ films, it goes without saying that these films can be adhered to the measurement wafer, the reference wafer and the standard wafer each to measure infrared absorption spectra described later.

The thicknesses of the SiO$_2$ film, the nitride film and the polyethylene film adhered to surfaces of the silicon wafers can be measured with an ellipsometer.

In the step 2, infrared absorption spectra of the measurement wafer with SiO$_2$ film, the reference wafer with SiO$_2$ film, and the standard wafer with SiO$_2$ film are measured by FT-IR.

When nitride films or polyethylene films are applied to wafers, the methods for measuring the interstitial oxygen concentration are the same as the method for measuring the interstitial oxygen concentration in the wafer with SiO$_2$ film in the steps 2 to 4. The method using the wafer with SiO$_2$ film is hereinafter described as a representative.

In the present invention, the interstitial oxygen concentration in the measurement wafer is measured by Fourier-transform infrared spectroscopy (FT-IR). The FT-IR is one of the infrared spectroscopic techniques to make a structural analysis and a quantitative analysis of a substance (specimen) by applying infrared rays on the substance and measuring the light transmitting or being reflected therefrom.

In measuring a specimen using the FT-IR, infrared light emitted from a light source passes through a Michelson interferometer in the optical path. The Michelson interferometer is composed of a half-silvered mirror (beam splitter), a mobile mirror, and a fixed mirror. The light is divided into two by the half-silvered mirror. After being reflected by both the mobile mirror and the fixed mirror, the two lights are composed together again by the half-silvered mirror. When the mobile mirror is reciprocated, the optical path difference is brought about between the mobile mirror and the fixed mirror. The Michelson interferometer can detect interference light composed by the phase difference between two lights varying with time. The interferogram is acquired by recording the interference light intensity along the horizontal axis as the optical path difference. The data directly taken from the FT-IR correspond to the interferogram which is a record of infrared light transmitted from the specimen. By Fourier transform using a computer, the infrared absorption spectrum having the wave number (cm$^{-1}$) on the horizontal axis is acquired.

Because the FT-IR measurement is single beam type spectroscopy, the FT-IR spectrophotometer cannot directly measure the transmittance (%) of a specimen. Therefore, at first, the background should be measured without setting any specimen, and then the specimen should be measured. The ratio of the spectrum for the background to that for the specimen is calculated using the following equation, which leads to the transmittance of the specimen.

IR spectrum=−log(specimen/background)

The FT-IR method includes transmission method, total reflection method, diffused reflection method, perpendicular incidence/transmission method, and infrared microspectrometry. Among these, the perpendicular incidence/transmission method is preferable.

Figure 1:
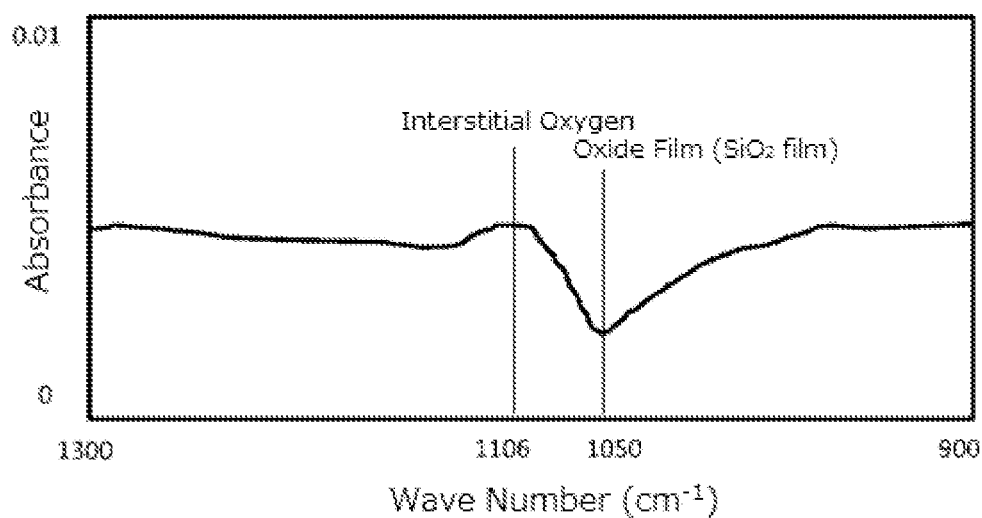
FIG. 1 illustrates a conventional infrared absorption spectrum of a single-crystal silicon wafer.

In the step 3, the absorption peak intensity observed at a center wave number of 1106 cm$^{-1}$ corresponding to interstitial oxygen is calculated from a difference spectrum (transmission spectrum) made by subtracting the infrared absorption spectrum of the reference wafer with SiO$_2$ film from the infrared absorption spectrum of the measurement wafer with SiO$_2$ film. As shown in FIG. 1, the position of the absorption peak of the interstitial oxygen is close to and partially overlapped with the absorption peak of the native oxide, so that the absorption peak intensity of the interstitial oxygen can be obtained through the steps 1 to 3.

The absorption peak attributed to the SiO$_2$ film, the natural oxide is successfully taken off by subtracting the infrared absorption spectrum of the reference wafer with SiO$_2$ film from the infrared absorption spectrum of the measurement wafer with SiO$_2$ film. And because the reference wafer is interstitial oxygen-free, only the absorption peak attributed to the interstitial oxygen of the measurement wafer with SiO$_2$ film is left.

In the step 4, the peak intensity of the interstitial oxygen obtained in the step 3 is compared with that of the interstitial oxygen at a center wave number of 1106 cm$^{-1}$ in the infrared absorption spectrum of the standard wafer with SiO$_2$ film. And the interstitial oxygen concentration in the measurement wafer is determined by proportional calculation based on the interstitial oxygen concentration value of the standard wafer. As the interstitial oxygen concentration of the standard wafer is known, the interstitial oxygen concentration in the measurement wafer can be calculated proportionally from the peak intensity.

EXAMPLES

Hereinafter, the present invention is described in further detail referring to Examples, but the present invention is not restricted to these Examples.

Example 1

A measurement silicon wafer, an interstitial oxygen-free reference wafer, and a standard silicon wafer with known interstitial oxygen concentration were prepared.

The three kinds of wafers were washed with hydrofluoric acid (HF) to remove native oxides. Next, 2 nm thick $SiO_2$ films were deposited on each surface of the wafers by chemical vapor deposition (CVD).

Figure 3:
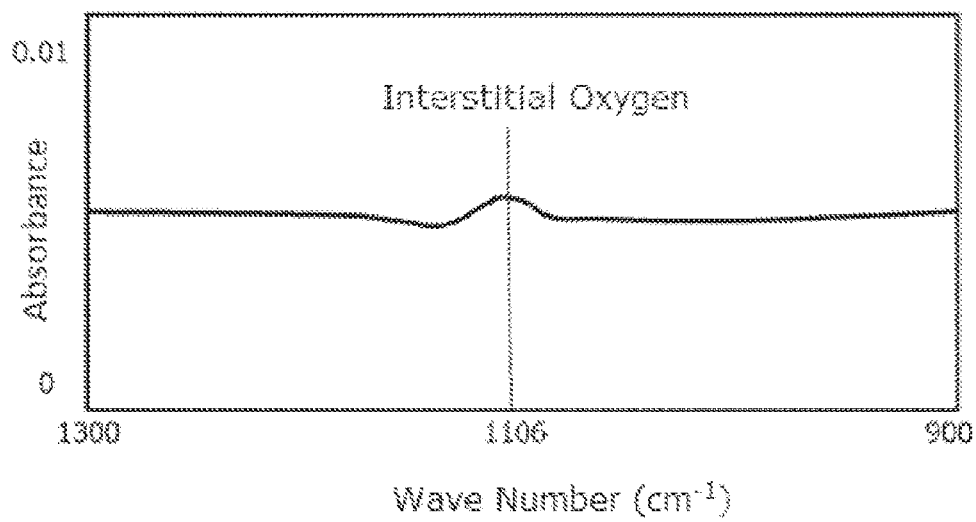
FIG. 3 illustrates a difference spectrum obtained by subtracting an infrared absorption spectrum of a reference wafer with a 2 nm-thick SiO₂ film from that of a measurement wafer with a 2 nm-thick SiO₂ film.

The FT-IR infrared absorption spectroscopic measurements were carried out on the three kinds of wafers with $SiO_2$ film. A difference spectrum (FIG. 3) was made by subtracting the absorption spectrum of the reference wafer with $SiO_2$ film from the absorption spectrum of the measurement wafer with $SiO_2$ film. The interstitial oxygen concentration of the measurement wafer was determined by proportional calculation based on the difference spectrum and the absorption peak attributed to the interstitial oxygen of the standard wafer with $SiO_2$ film. As a result, the interstitial oxygen concentration was $0.5 \times 10^{16}$ atoms/cm$^3$.

The SIMS analysis was carried out on the same wafer as the measurement silicon wafer whose interstitial oxygen concentration was determined. The wafer had an oxygen concentration of $0.5 \times 10^{16}$ atoms/cm$^3$, which was in good agreement with the result of FT-IR measurement.

Example 2

Similarly, to Example 1, a measurement silicon wafer, an interstitial oxygen-free reference wafer, and a standard silicon wafer with known interstitial oxygen concentration were prepared.

The three kinds of wafers were washed with hydrofluoric acid (HF) to remove native oxides. Next, 10 nm-thick nitride films were formed on each surface of the wafers by heating at 1000° C. for 1 hour in an atmosphere of ammonia ($NH_3$) gas and silane ($SiH_4$) gas.

Figure 4:
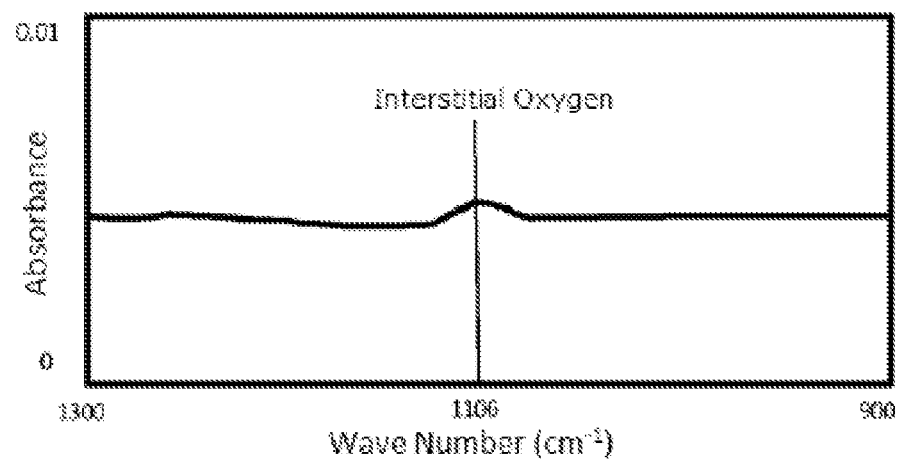
FIG. 4 illustrates a difference spectrum obtained by subtracting an infrared absorption spectrum of a reference wafer with a 5 nm-thick nitride film from that of a measurement wafer with a 5 nm-thick nitride film.

Similarly, to Example 1, the FT-IR infrared absorption spectroscopic measurements were carried out to determine the interstitial oxygen concentration of the measurement wafer. As a result, the interstitial oxygen concentration was $0.5 \times 10^{16}$ atoms/cm$^3$. This concentration was in good agreement with the result from SIMS measurement. FIG. 4 shows a difference spectrum made by subtracting the absorption spectrum of the reference wafer with nitride film from that of the measurement wafer with nitride film.

Comparative Example 1

A measurement silicon wafer, an interstitial oxygen-free reference wafer, and a standard silicon wafer with known interstitial oxygen concentration were prepared.

The three kinds of wafers were subjected to the FT-IR infrared absorption spectroscopic measurements without removing native oxides by means of hydrofluoric acid (HF) cleaning, etc., and without adhering any of $SiO_2$ films, nitride films, and polyethylene films (in a state of the native oxides attached). A difference spectrum made by subtracting the absorption spectrum of the reference wafer from the absorption spectrum of the measurement wafer confirmed a spectrum of a large reverse absorption of convex downward shape due to the native oxide on the side of lower wave number (1050 cm$^{-1}$) than the absorption spectrum (center wave number: 1106 cm$^{-1}$) due to the interstitial oxygen (FIG. 1). Because the spectrum of a large reverse absorption of convex downward shape was an obstacle to draw a baseline on the absorption spectrum of the interstitial oxygen, the oxygen concentration could not be acquired with high accuracy.

INDUSTRIAL APPLICABILITY

According to the present invention, the extremely low oxygen concentration in a silicon wafer can be measured easily and sensitively by use of the FT-IR.

The invention claimed is:

1. A method for measuring oxygen concentration in a single-crystal silicon wafer having an interstitial oxygen concentration of less than $1.0 \times 10^{16}$ atoms/cm$^3$, the method comprising:
    a step 1 of forming $SiO_2$ films of the same thickness on each surface of a measurement silicon wafer, an interstitial oxygen-free reference silicon wafer, and a standard silicon wafer with known interstitial oxygen concentration;
    a step 2 of measuring infrared absorption spectra of the measurement silicon wafer with $SiO_2$ film, the reference silicon wafer with $SiO_2$ film, and the standard silicon wafer with $SiO_2$ film by Fourier-transform infrared spectroscopy (FT-IR);
    a step 3 of obtaining an infrared absorbance difference spectrum (transmission spectrum) from the infrared absorption spectrum of the measurement silicon wafer with $SiO_2$ film and the infrared absorption spectrum of the reference silicon wafer with $SiO_2$ film, and thereby obtaining the absorption peak intensity corresponding to interstitial oxygen; and
    a step 4 of calculating the interstitial oxygen concentration in the measurement silicon wafer based on the interstitial oxygen concentration value of the standard silicon wafer, comparing the peak intensity of the interstitial oxygen with the peak intensity of the interstitial oxygen of the standard silicon wafer with $SiO_2$ film.

2. The method for measuring oxygen concentration in a single-crystal silicon wafer according to claim 1, wherein in the step 1, the $SiO_2$ film thickness is 2 to 40 nm.

3. A method for measuring oxygen concentration in a single-crystal silicon wafer having an interstitial oxygen concentration of less than $1.0 \times 10^{16}$ atoms/cm$^3$, the method comprising:
    a step 1 of forming nitride films on each surface of a measurement silicon wafer, an interstitial oxygen-free reference silicon wafer, and a standard silicon wafer with known interstitial oxygen concentration;
    a step 2 of measuring infrared absorption spectra of the measurement silicon wafer with nitride film, the reference silicon wafer with nitride film, and the standard silicon wafer with nitride film by Fourier-transform infrared spectroscopy (FT-IR);
    a step 3 of obtaining a transmission spectrum from the infrared absorption spectrum of the measurement silicon wafer with nitride film and the infrared absorption spectrum of the reference silicon wafer with nitride film, and thereby obtaining the absorption peak intensity corresponding to interstitial oxygen; and a step 4 of calculating the interstitial oxygen concentration in the measurement silicon wafer based on the interstitial oxygen concentration value of the standard silicon wafer, comparing the peak intensity of the interstitial oxygen with the peak intensity of the interstitial oxygen of the standard silicon wafer with nitride film.

4. The method for measuring oxygen concentration in a single-crystal silicon wafer according to claim 3, wherein in the step 1, the nitride film thickness is 1 to 10 nm.

5. A method for measuring oxygen concentration in a single-crystal silicon wafer having an interstitial oxygen concentration of less than $1.0 \times 10^{16}$ atoms/cm$^3$, the method comprising:

a step 1 of forming polyethylene films on each surface of a measurement silicon wafer, an interstitial oxygen-free reference silicon wafer, and a standard silicon wafer with known interstitial oxygen concentration;

a step 2 of measuring infrared absorption spectra of the measurement silicon wafer with polyethylene film, the reference silicon wafer with polyethylene film, and the standard silicon wafer with polyethylene film by Fourier-transform infrared spectroscopy (FT-IR);

a step 3 of obtaining a transmission spectrum from the infrared absorption spectrum of the measurement silicon wafer with polyethylene film and the infrared absorption spectrum of the reference silicon wafer with polyethylene film, and thereby obtaining the absorption peak intensity corresponding to interstitial oxygen; and a step 4 of calculating the interstitial oxygen concentration in the measurement silicon wafer based on the interstitial oxygen concentration value of the standard silicon wafer, comparing the peak intensity of the interstitial oxygen with the peak intensity of the interstitial oxygen of the standard silicon wafer with polyethylene film.

* * * * *